United States Patent [19]
Fujisawa

[11] Patent Number: 5,196,807
[45] Date of Patent: Mar. 23, 1993

[54] AMPLIFYING CIRCUIT

[75] Inventor: Masanori Fujisawa, Kumagaya, Japan

[73] Assignee: Sanyo Electric Co., Ltd., Osaka, Japan

[21] Appl. No.: 751,941

[22] Filed: Aug. 29, 1991

[30] Foreign Application Priority Data

Aug. 30, 1990 [JP] Japan .................................. 2-230434

[51] Int. Cl.⁵ .............................................. H03G 3/20
[52] U.S. Cl. .................................... 330/254; 330/136; 330/140
[58] Field of Search ............... 330/136, 140, 254, 257, 330/261, 285; 381/120

[56] References Cited

U.S. PATENT DOCUMENTS

| | | | |
|---|---|---|---|
| 3,919,654 | 11/1975 | Toumani | 330/136 X |
| 4,077,013 | 2/1978 | Morez et al. | 330/267 |
| 4,837,523 | 6/1989 | Wright | |
| 4,922,208 | 5/1990 | Susak et al. | 330/255 |
| 4,935,703 | 6/1990 | Poletto | 330/255 |

FOREIGN PATENT DOCUMENTS 58-079476 5/1983 Japan .
1517163 7/1978 United Kingdom .

Primary Examiner—Steven Mottola
Attorney, Agent, or Firm—Armstrong, Westerman, Hattori, McLeland & Naughton

[57] ABSTRACT

An amplifying circuit with a small current consumption which is used for a portable radio, personal stereo systems or the like. The operating current of a differential amplifier, which is the main component of the amplifying circuit, is controlled by a first current circuit, which is a fixed constant-current source, and a second current circuit, which is a variable current source. The current of the second current circuit is controlled by an input audio signal with the voltage subjected to full-wave rectification. As a result, when the amplitude of the input signal is small, only a slight operating current is consumed by the first current circuit, thereby saving electricity. On the other hand, when the amplitude of an input audio signal is large, the current of the second current circuit also increases therewith, so that the amplifier flows a sufficiently large output current. Thus, it is possible to amplify the current in correspondence with the amplitude of an input signal, while reducing the operating current when the amplitude of an input signal is small, thereby reducing the current consumption.

7 Claims, 5 Drawing Sheets

AMPLIFYING CIRCUIT

BACKGROUND OF THE INVENTION

1. Field of the Invention

The present invention relates to an amplifying circuit for amplifying an input audio signal and the like and, more particularly, to an amplifier which reduces the power consumption so as to be suitable for portable personal stereos and the like.

2. Description of the Related Art

As an amplifying circuit for amplifying an input audio signal in a portable radio, a personal stereo system, an amplifying circuit such as that shown in FIG. 5 is conventionally used.

In FIG. 5, an amplifying circuit 1 is mainly composed of an amplifier A1. DC power is supplied to a terminal 5 of the amplifier A1 and a constant-current source 7 for determining the operating current of the amplifier A1 is connected to a terminal 4.

The signal input to a signal input terminal 2 is supplied to the non-inverting input of the amplifier A1.

A DC power source 8 is connected to a reference voltage terminal 6 and the DC power source 8 is connected to the inverting input of the amplifier A1 through a resistor R2.

The amplifier A1 amplifies the input signal supplied to the non-inverting input at an amplification level determined by the ratio of the resistance values of a resistor R3 and a resistor R2, and outputs the amplified signal to a capacitor C1 and a resistor R6 through a signal output terminal 3.

The output current of the constant-current source 7 connected to the terminal 4 is set at such a value that the amplifier A1 can drive a load at the maximum output.

Since the operating current which flows in the above-described conventional amplifying circuit is constant whether the input signal is a zero signal, a minute signal or a large signal, the amplifying circuit wastes power when a minute signal or no signal is input.

SUMMARY OF THE INVENTION

Accordingly, it is an object of the present invention to eliminate the above-described problems in the related art and to provide an amplifying circuit which is capable of controlling the operating current which flows in the amplifying circuit in accordance with an input signal so as to reduce the power consumption.

To achieve this aim, the present invention provides an improved amplifying circuit for amplifying an input signal comprising: a constant-current source for determining the operating current of the amplifying circuit; and a full-wave rectifier for subjecting the input signal to full-wave rectification, wherein the current flowing in the constant-current source is so controlled in accordance with the signal output from the full-wave rectifier as to reduce the operating current.

The constant-current source includes a first current circuit for causing a constant current having a predetermined value to flow, and a second current circuit for causing a current corresponding to the signal output from the full-wave rectifier to flow. When the input signal is below a predetermined value, the operating current of the amplifying circuit is determined in accordance with the first current circuit, while when the input signal is above the predetermined value, the operating current of the amplifying circuit is determined in accordance with the first and second current circuits.

In the present invention, the input signal is subjected to full-wave rectification by use of the full-wave rectifier, and the current flowing in the constant-current source of the amplifying circuit is controlled by using the signal output from the full-wave rectifier. It is therefore possible to reduce the operating current flowing in the amplifying circuit when no signal is input, and to cause the operating current which corresponds to the level of an input signal to flow in the amplifying circuit when the input signal is applied.

The above and other objects, features and advantages of the present invention will become clear from the following description of the preferred embodiment thereof, taken in conjunction with the accompanying drawings.

DESCRIPTION OF THE PREFERRED EMBODIMENT

A preferred embodiment of the present invention will be explained hereinunder with reference to the accompanying drawings.

Circuit Structure

Figure 1:
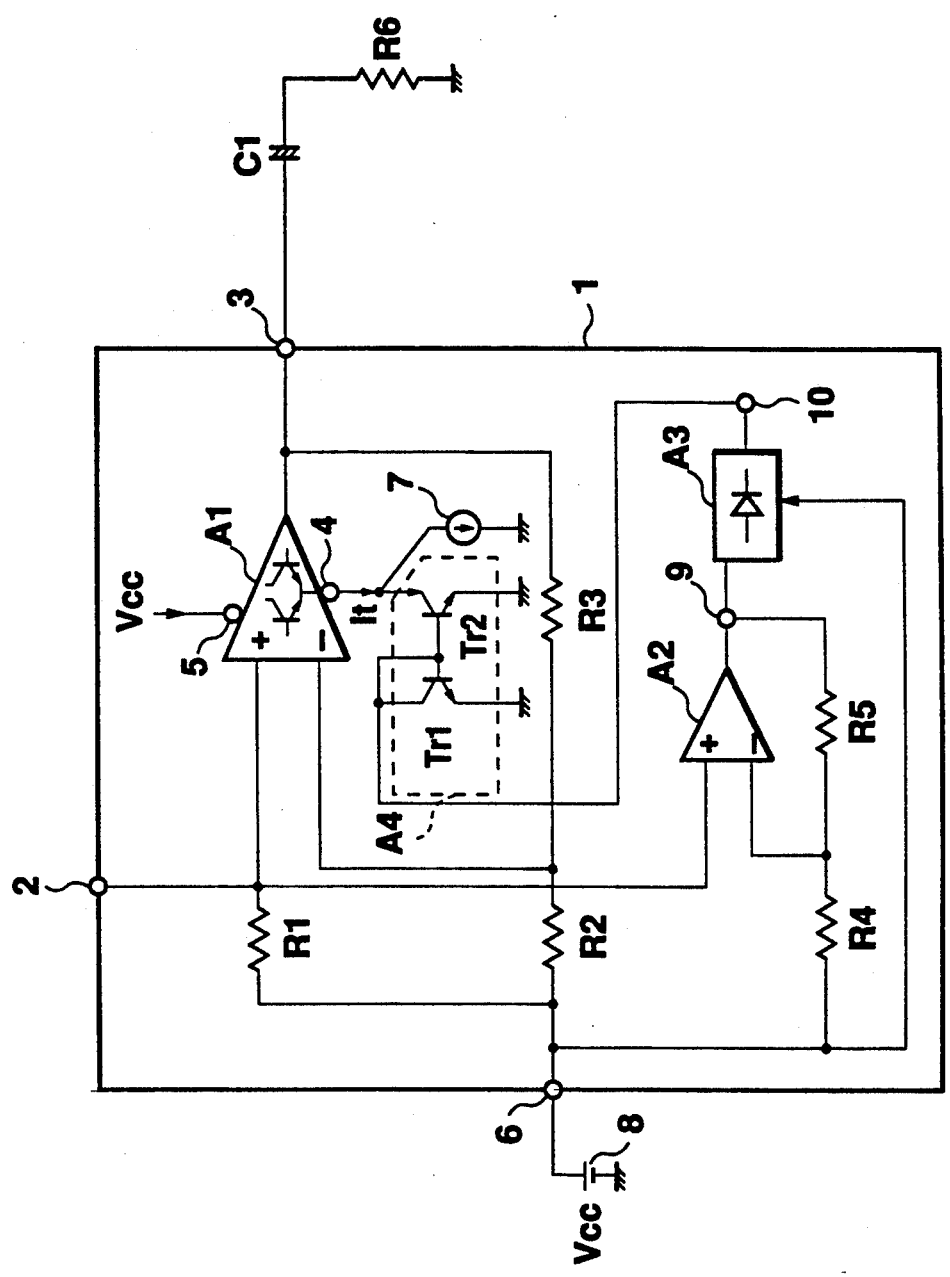
FIG. 1 is a circuit diagram of a preferred embodiment of an amplifying circuit according to the present invention.

Referring to FIG. 1, an amplifying circuit is mainly composed of an amplifier A1, an input amplifier A2, a full-wave rectifier A3 and a current mirror circuit A4.

Figure 2:
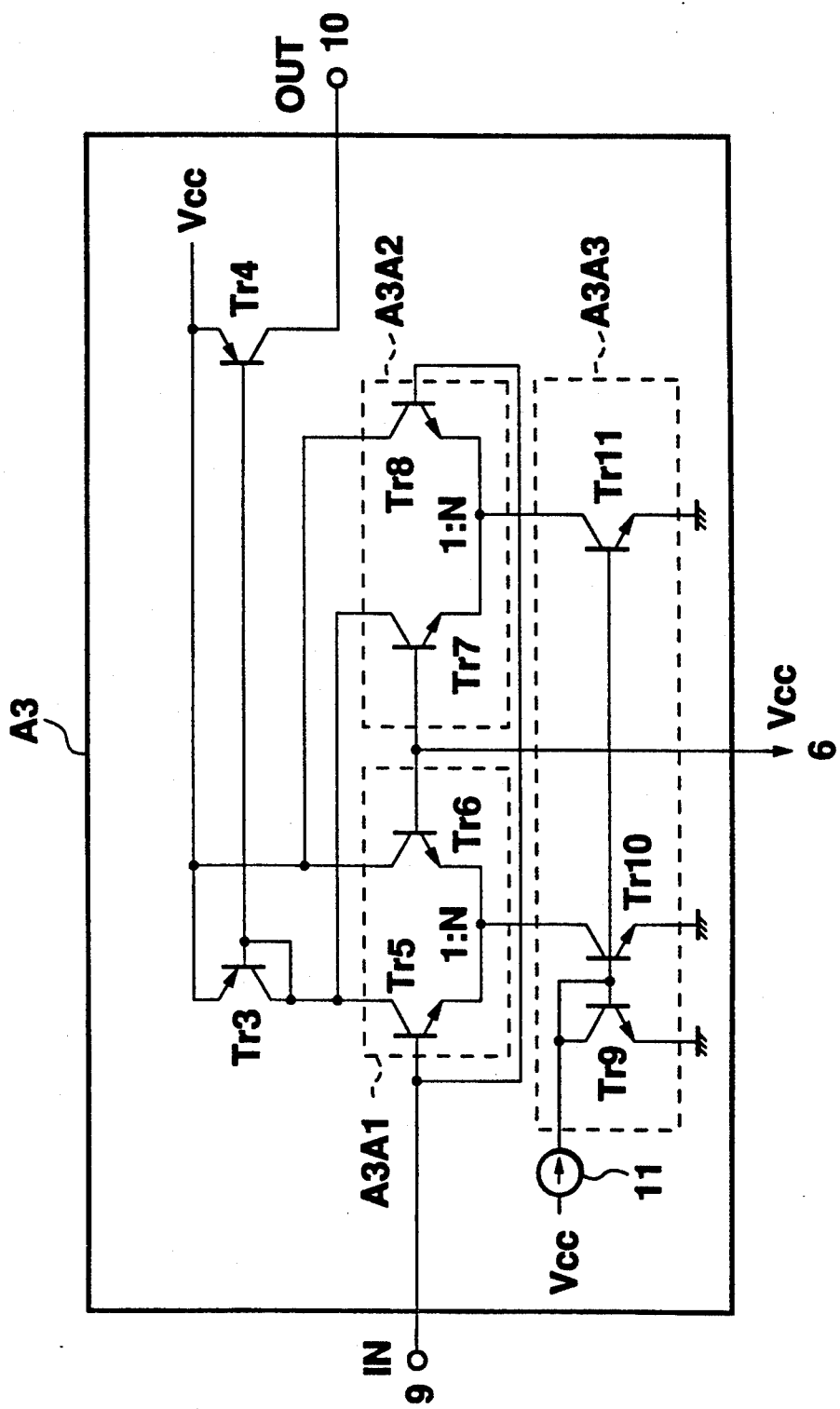
FIG. 2 is a circuit diagram of a full-wave rectifier used in the embodiment shown in FIG. 1.

As can be seen from FIG. 2, the full-wave rectifier A3 is mainly composed of a first differential amplifier A3A1, a second differential amplifier A3A2, a current mirror circuit A3A3 and a constant-current source 11.

In the amplifying circuit 1 shown in FIG. 1, a signal input terminal 2 is connected to the non-inverting inputs of the amplifiers A1 and A2.

A reference voltage terminal 6 is connected to the non-inverting input of the amplifier A1 through a resistor R1, to the inverting input of the amplifier A1 through a resistor R2, to the inverting input of the amplifier A2 through a resistor R4, and further to the power input of the full-wave rectifier A3.

The output of the amplifier A1 is connected to a signal output terminal 3, and also to the inverting input of the amplifier A1 through a resistor R3.

A terminal 5 is a power terminal of the amplifier A1 and it is connected to the power source.

A constant-current source 7 which constitutes a first current circuit and the output terminal of the current mirror circuit A4 which constitutes a second current circuit are connected to a terminal 4 so as to determine the operating current of the amplifier A1.

The output of the amplifier A2 is connected to an input terminal 9 of the full-wave rectifier A3, and also to the inverting input of the amplifier A2 through a resistor R5. The output terminal of the full-wave rectifier A3 is connected to the input of the current mirror circuit A4.

The current mirror circuit A4 includes transistors Tr1 and Tr2. The collector and the base of the transistor Tr1 are connected to the output terminal 10 of the full-wave rectifier A3 and the emitter thereof is grounded. The base of the transistor Tr2 is connected to the base of the transistor Tr1, the emitter of Tr2 is grounded and the collector is connected to the terminal 4.

In the full-wave rectifier A3 shown in FIG. 2, the reference voltage is applied to the base of a transistor Tr6 of the first differential amplifier A3A1 and the base of a transistor Tr7 of the second differential amplifier A3A2.

The input terminal 9 is connected to the base of a transistor Tr5 of the first differential amplifier A3A1 and to the base of a transistor Tr8 of the second differential amplifier A3A2.

The emitters of the transistors Tr5 and Tr6 of the first differential amplifier A3A1 are connected to the collector of a transistor Tr10 of the current mirror circuit A3A3, and the emitters of the transistors Tr7 and Tr8 of the second differential amplifier A3A2e are connected to the collector of a transistor Tr11 of the current mirror circuit A3A3.

The current mirror circuit A3A3 is composed of transistors Tr9, Tr10 and Tr11. The base and the collector of the transistor Tr9 of the current mirror circuit A3A3 are connected to the constant-current source 11, and the bases of the transistors Tr9, Tr10 and Tr11 are all connected together.

The collector of the transistor Tr4 is connected to the output terminal 10, and the base thereof is connected to the base and the collector of the transistor Tr3.

The base and the collector of the transistor Tr3 are further connected to the collector of the transistor Tr5 of the first differential amplifier A3A1 and the collector of the transistor Tr7 of the second differential amplifier A3A2, and the emitter of the transistor Tr3 is connected to the power source.

The collector of the transistor Tr6 of the first differential amplifier A3A1 is connected to the power source, and the collector of the transistor Tr8 of the second differential amplifier A3A2 is also connected to the power source.

The amplifier A1 is composed of a differential amplifier, and a SEPP (single-ended push-pull) amplifier, but since this is a generally used amplifier, the details thereof are omitted.

Circuit Operation

In FIG. 1, an audio signal which is input to the signal input terminal 2 is amplified by the amplifier A1 and supplied to a load resistor R6 such as a speaker through a capacitor C1. The input audio signal is further input to the input amplifier A2 so as to be amplified at an amplification level which is determined by the ratio of the resistance values of the resistors R5 and R4. The output signal of the input amplifier A2 is supplied to the full-wave rectifier A3.

In FIG. 2, the signal input to the input terminal 9 is supplied to the base of the transistor Tr5 of the first differential amplifier A3A1 of the full-wave rectifier A3 and to the base of the transistor Tr8 of the second differential amplifier A3A2.

Both the areal ratio of the emitters of the transistors Tr5 and Tr6 and the areal ratio of the emitters of the transistors Tr7 and Tr8 are set at 1 : N (1<N). For this reason, the rising voltage between base and emitter of the transistors Tr6 and Tr8 is smaller than the rising voltage between base and emitter of the transistors Tr5 and Tr7, so that it is possible to generate an offset voltage which corresponds to the difference between the two voltages. Accordingly, the transistor Tr5 is maintained in the OFF state until the input signal exceeds the offset voltage, when the transistor is turned ON. The value N is set at about 5 to 10.

In the case in which no signal is input:

While no signal is input to the input terminal 9, the transistor Tr6 and Tr8 are ON while the transistors Tr5 and Tr7 are maintained in the OFF state due to the offset voltage. The transistors Tr3 and Tr4 are also turned OFF, so that no output current is generated at the output terminal 10. As is clear from FIG. 2, since the transistors Tr10 and Tr11 which constitute the respective constant-current sources are connected to the common emitters of the differential amplifiers A3A1 and A3A2, respectively, when there is no input signal, the transistors Tr6, Tr8, which are preferentially turned ON due to the offset voltage are constantly turned ON in preference to the transistors Tr5, Tr7, which are delayed by the offset voltage with respect to these transistors Tr6, Tr8 and are fixed in the OFF state. Therefore, the transistors Tr3 and Tr4 are also maintained in the OFF state.

No current therefore flows in the current mirror circuit A4, and only the constant-current source 7, which constitutes the first current circuit, is connected as the constant-current source of the amplifier A1. Thus, the operating current of the amplifier A1 corresponds to a minute current $I_t$ which flows on the constant-current source 7, so that it is possible to reduce the current consumption.

In the case in which there is an input signal:

When a signal is input to the input terminal 9 and the amplitude of the signal exceeds the offset voltage in the positive direction, the transistor Tr5 is turned ON and, hence, the transistors Tr3 and Tr4 are also turned ON. A current is produced on the output terminal 10 and the current is supplied to the current mirror circuit A4. It will be understood that at this time, with the progress of the ON operation of the transistor Tr5, the ON state of the opposite transistor Tr6 is gradually diminished. While the transistor Tr6 is turned ON due to the offset voltage, the initial state of the transistor Tr8 in the other differential amplifier A3A2 is changed into the ON state. As a result, since the opposite transistor Tr7 maintains the OFF state, the current flowing in the transistors Tr3 and Tr4 is determined only by the operating state of the transistor Tr5. The current increases as the amplitude of the signal increases beyond a predetermined amplitude. As a result, the current supplied from the second current circuit which is composed of the current mirror circuit A4 is supplied to the amplifier A1 shown in FIG. 1 in addition to the constant current which is supplied from the constant-current source 7 which constitutes the first current circuit, and the operating current of the amplifier A1 is sequentially increased in correspondence with the absolute value of the amplitude of the input signal. The operating current of the amplifier A1 therefore increases in accordance with the level of the input signal, and the amplifier A1 amplifies the input signal without distortion.

When the amplitude of the input signal increases in the negative direction and exceeds the offset voltage in the negative direction, the transistor Tr7 is turned ON and the current which is equal to the collector current of the transistor Tr7 flows in the transistors Tr3 and Tr4, and the current is led to the output terminal 10.

Therefore, the current generated on the output terminal 10 flows in the current mirror circuit A4 and the operating current of the amplifier A1 increases. In this way, the operating current of the amplifier A1 also increases in the negative direction with the increase in the amplitude of the input signal in the same way as in the positive direction.

Figure 3:
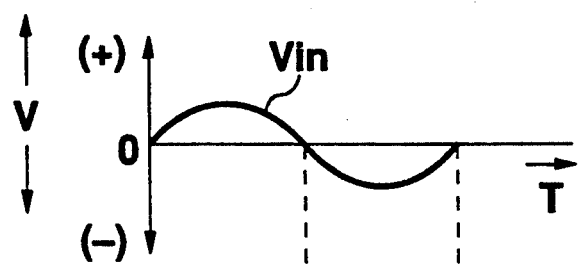
FIGS. 3a, 3b, and 3c show the waveforms of the signals output from some elements in the embodiment shown in FIG. 1.
Figure 3:
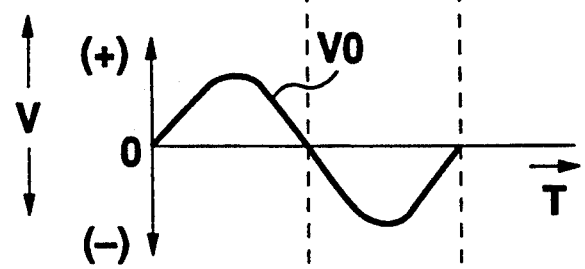
Figure 3:
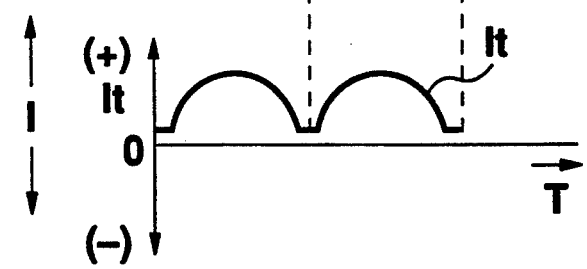

FIG. 3(a) shows the waveform of a signal Vin which is supplied to the signal input terminal 2 of the amplifying circuit 1, FIG. 3(b) shows the waveform of a signal Vo which is amplified by the amplifier A1 of the amplifying circuit 1 and output to the signal output terminal 3, and FIG. 3(c) shows the waveform of a current $I_t$ which flows to the terminal 4 of the amplifying circuit 1.

Figure 4:
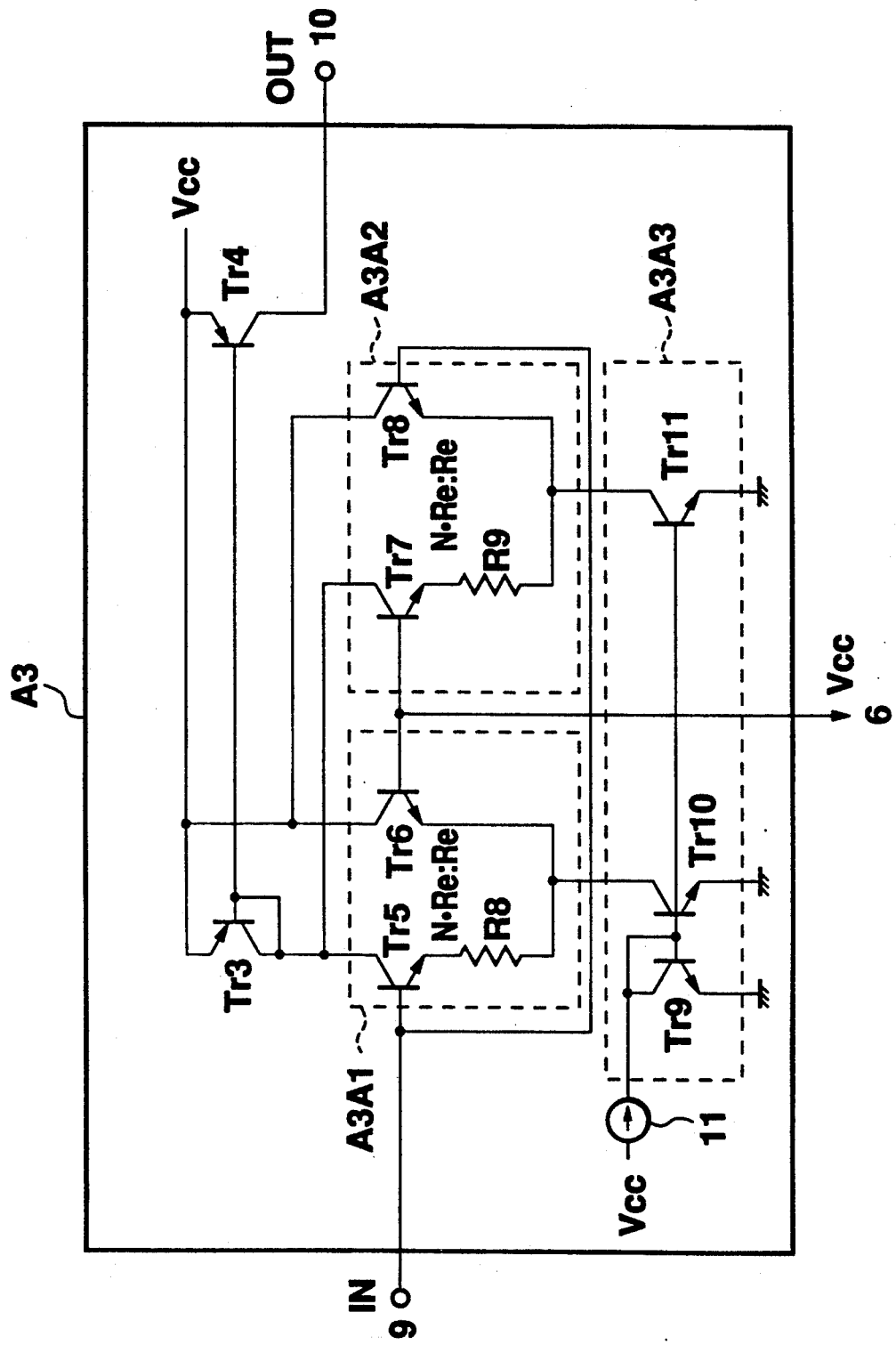
FIG. 4 is a circuit diagram of another example of a full-wave rectifier used in the embodiment shown in FIG. 1.
Figure 5:
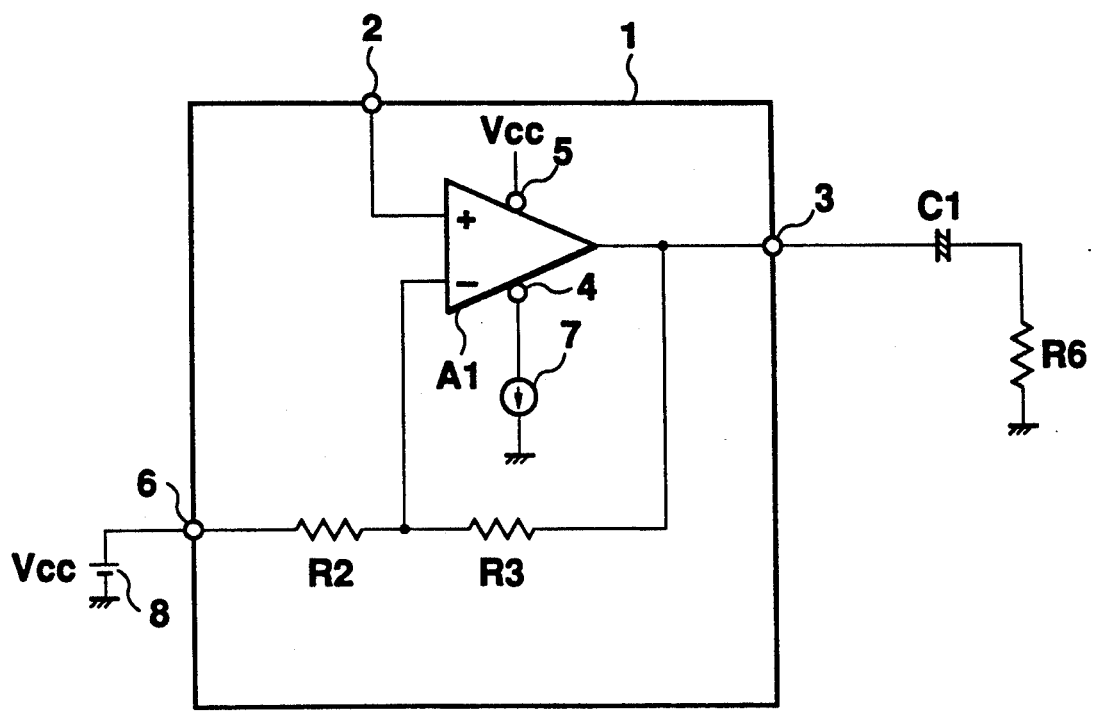
FIG. 5 is a circuit diagram of a conventional amplifying circuit.

FIG. 4 shows another example of a full-wave rectifier used in the present invention. In the full-wave rectifier A3 shown in FIG. 2, a desired offset voltage is obtained by setting the areal ratio of the emitters of each pair of transistors Tr5, Tr6 and Tr7, Tr8 of the differential amplifiers A3A1 and A3A2, respectively, at 1 : N. In contrast, in the full-wave rectifier shown in FIG. 4, the areas of the emitters of each pair of transistors Tr5, Tr6 and Tr7, Tr8 of are set at approximately the same value and emitter resistors R8, R9 are connected to the emitters of the transistors Tr5 and Tr7, respectively, thereby obtaining an offset voltage. The resistances of these inserted resistors R8, R9 are set so that the total emitter resistance of the transistors Tr5 and Tr7 is N times as large as the emitter resistance Re of each of the transistors Tr6, Tr8. As a result, an offset voltage is obtained in the same way as in the full-wave rectifier shown in FIG. 2.

As described above, according to the present invention, when the signal input to the amplifying circuit is a minute signal or a zero signal, it is possible to reduce the current consumption as compared with the related art.

Incidentally, according to the present invention, it is possible to reduce the current of 8 to 15 mA which flows in the amplifier A1 in the related art to about 2 to 3 mA.

In addition, since it is possible to increase the operating current in accordance with the level of the input signal when a signal beyond a predetermined level is input, it is possible to amplify an input signal at a large level without distortion.

While there has been described what is at present considered to be a preferred embodiment of the invention, it will be understood that various modifications may be made thereto, and it is intended that the appended claims cover all such modifications as fall within the true spirit and scope of the invention.

I claim:

1. An amplifying circuit for amplifying an input signal, comprising:
   a constant-current source for determining the operating current of the amplifying circuit; and
   a full-wave rectifier for subjecting the input signal to full-wave rectification,
   wherein the constant-current source includes a first current circuit for causing a constant current having a predetermined value to flow, and a second current circuit for causing a current corresponding to the signal output from the full-wave rectifier to flow so that when the input signal is below a predetermined value, the operating current of the amplifying circuit is determined in accordance with the first current circuit, while when the input signal is above the predetermined value, the operating current of the amplifying circuit is determined in accordance with the first and second current circuits.

2. An amplifying circuit according to claim 1, wherein the second current circuit includes a current mirror circuit connected in parallel with a constant-current source which constitutes the first current circuit, and the current of the current mirror circuit is controlled by the output of the full-wave rectifier.

3. An amplifying circuit for amplifying an input signal, comprising:
   a first constant-current source for determining the operating current of the amplifying circuit; and
   a full-wave rectifier for subjecting the input signal to full-wave rectification,
   wherein the full-wave rectifier includes two differential amplifiers, a second constant-current source for supplying a constant current to the common emitter of the differential amplifiers and an output circuit for supplying the outputs of the differential amplifiers to the first constant-current source so as to control the current flowing in the first constant-current source, and each of the differential amplifiers is composed of a pair of transistors having different rising voltages between base and emitter so that the controlling timing of the first constant current source is determined by an offset voltage which is the difference between the two rising voltages, and
   wherein the current flowing in the constant-current source is so controlled in accordance with the signal output from the full-wave rectifier as to reduce the operating current of the amplifying circuit.

4. An amplifying circuit according to claim 3, wherein the offset voltage is determined by the areal ratio of the emitters of the pair of transistors which constitute each of the differential amplifiers.

5. An amplifying circuit according to claim 4, wherein the areal ratio of the emitters is set to between 1 : 5 and 1: 10.

6. An amplifying circuit according to claim 5, wherein the amplifying circuit is an integrated circuit.

7. An amplifying circuit according to claim 3, wherein the offset voltage is determined by the resistances of emitter resistors inserted between each pair of transistors which constitute each of the differential amplifiers.

* * * * *